United States Patent
Emoto et al.

(10) Patent No.: US 7,355,853 B2
(45) Date of Patent: Apr. 8, 2008

(54) MODULE STRUCTURE AND MODULE COMPRISING IT

(75) Inventors: Hideyuki Emoto, Tokyo (JP); Masahiro Ibukiyama, Tokyo (JP); Isao Sugimoto, Tokyo (JP); Manabu Uto, Tokyo (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 309 days.

(21) Appl. No.: 10/496,005

(22) PCT Filed: Nov. 8, 2002

(86) PCT No.: PCT/JP02/11698

§ 371 (c)(1),
(2), (4) Date: Dec. 6, 2004

(87) PCT Pub. No.: WO03/046981

PCT Pub. Date: Jun. 5, 2003

(65) Prior Publication Data
US 2005/0117302 A1 Jun. 2, 2005

(30) Foreign Application Priority Data
Nov. 29, 2001 (JP) .............................. 2001-364363

(51) Int. Cl.
*H05K 7/20* (2006.01)
(52) U.S. Cl. ............... 361/704; 257/712; 361/707; 361/708; 361/715; 361/719; 165/80.3; 165/185; 428/469
(58) Field of Classification Search ..................... None
See application file for complete search history.

(56) References Cited

U.S. PATENT DOCUMENTS

| 4,568,586 | A |   | 2/1986  | Gobrecht |
|-----------|---|---|---------|----------|
| 5,130,498 | A | * | 7/1992  | Yoshida et al. ............. 174/252 |
| 5,213,877 | A | * | 5/1993  | Yoshida et al. ............. 428/209 |
| 5,481,136 | A | * | 1/1996  | Kohmoto et al. ........... 257/712 |
| 5,602,720 | A |   | 2/1997  | Natsuhara et al. |
| 5,654,586 | A |   | 8/1997  | Schwarzbauer |
| 5,675,474 | A | * | 10/1997 | Nagase et al. .............. 361/704 |
| 5,751,552 | A | * | 5/1998  | Scanlan et al. ............. 361/707 |
| 6,033,787 | A |   | 3/2000  | Nagase et al. |

(Continued)

FOREIGN PATENT DOCUMENTS

EP        693776        1/1996

(Continued)

*Primary Examiner*—Gregory D Thompson
(74) *Attorney, Agent, or Firm*—Oblon, Spivak, McClelland, Maier & Neustadt, P.C.

(57) ABSTRACT

A module is provided that has high reliability in the junction between a ceramic circuit board and a heat sink, undergoes small changes in shape and warp of a module structure comprising a ceramic circuit board and a metal heat sink event under a temperature history during power module assembly and power module actual use, eliminates an unfavorableness during power module assembly, and maintains high reliability over a long period of time. A module structure characterized in that in a module member formed by bonding the ceramic circuit board to the metal heat sink via a metal plate (A) the main component of which is aluminum, the metal plate (A) has a thickness of 400 μm or more and 1,200 μm or less.

7 Claims, 6 Drawing Sheets

U.S. PATENT DOCUMENTS 6,204,553 B1 * 3/2001 Liu et al. .................... 257/676
6,309,737 B1 10/2001 Hirashima et al.
6,512,674 B1 * 1/2003 Tozawa .................... 361/704

FOREIGN PATENT DOCUMENTS

| JP | 7-142647 | 6/1995 |
| JP | 9-97865 | 4/1997 |
| JP | 10-189845 | 7/1998 |
| JP | 10-270596 | 10/1998 |
| JP | 2001-121287 | 5/2001 |

* cited by examiner

MODULE STRUCTURE AND MODULE COMPRISING IT

TECHNICAL FIELD

The present invention relates to a module comprising a metal heat sink and a ceramic circuit board on which is mounted a heat-generating electric component, such as a power device. The present invention particularly relates to a module which is to be suitably used for power source and to a module structure used in the module.

BACKGROUND ART

In recent years, due to the development of power electronics, apparatuses controlled by a power device, such as IGBT and MOS-FET are rapidly increasing. In particular, power-device controlling is rapidly proceeding in transportation apparatuses such as electric railway transportation apparatus and vehicles. Furthermore, in accordance with increased concern about environmental problems, for example, electric cars, and hybrid cars using both a gasoline engine and an electric motor, have begun to be placed on the market, so that the demand for power modules to be mounted thereon is expected to increase. For such use, particularly high reliability is required in view of the object of its use.

In a conventional power module, in order to prevent the temperature of a semiconductor device from raising above a predetermined temperature by causing the heat generated in the semiconductor or the like to dissipate outside, the structure thereof is generally such that a semiconductor device is mounted on a ceramic circuit board of aluminum oxide ($Al_2O_3$), silicon nitride ($Si_3N_4$), aluminum nitride (AlN), or the like by soldering, and is soldered to a heat sink which is composed of a metal such as copper (Cu) or aluminum (Al).

In the case of such a structure, however, it may occur that a solder layer between the ceramic circuit board and the heat sink cracks when subjected to a heat cycle during the operation of the semiconductor device, or to changes in the temperature of the operating environment, or the like. The solder layer cracks due to a thermal stress generated by a difference between the thermal expansion of a ceramic substrate and that of the heat sink. The presence of cracks in the solder layer (hereinafter simply referred to as the "solder cracks") lowers the dissipation of the heat generated in the semiconductor device and elevates the temperature of the semiconductor device. As a result, the semiconductor device becomes deteriorated, and the reliability of the power module is lowered as a whole.

As semiconductor apparatus becomes highly integrated and requires higher power, higher heat dissipation is demanded, and it is desired to make the solder free of lead in view of the environmental pollution. However, a so-called lead-free solder has a problem that the reliability thereof is lower than that of Pb—Sn solders which are currently used widely, although the heat conductivity of the lead-free solider is high.

In order to avoid these problems, it is being studied to use in the heat sink an Al—SiC composite material or a Cu—Mo composite material, which has such a thermal expansion coefficient that is closer to that of the ceramic substrate. However, in comparison with a conventional metal heat sink, such a heat sink has the problems that the heat sink has to be fabricated by a special process and the processing step and the surface treatment step therefor are more costly and such a heat sink is by far more expensive.

On the other hand, there has been conducted a trial of directly bonding a heat sink and a ceramic circuit board by using a brazing filler metal instead of a solder in order to avoid the occurrence of solder cracking and to improve on heat dissipation (refer to JP-A-9-97865 and JP-A-10-270596).

In this case, however, such problems are caused that debonding of a junction interface and cracking of the ceramic circuit board become apt to occur due to the thermal stress generated by a difference in thermal expansion between the ceramic circuit board and the metal heat sink, and that the stress applied to the solder that bonds a semiconductor device and the ceramic circuit board is increased, so that cracking of the solder under the semiconductor device becomes apt to occur more easily. Furthermore, the shape and warp of the heat sink may greatly change under a heat history during the assembly process of the power module or under the actual use thereof, so that there may be a case where a problem is caused during the assembling of the power module, and the lowering of heat dissipation performance takes place due to a decrease in the close contact between the heat sink and a heat dissipation block.

The present invention was made in view of the above-mentioned circumstances, and an object of the present invention is to provide a module which has a module structure comprising a ceramic circuit board and a metal heat sink, the module structure being such that the changes in the shape thereof are small even under a heat history during the assembly thereof and under the actual use thereof, and the assembling thereof is easy, abnormalities such as the debonding at the junction interface, the cracking of a ceramic substrate, the formation of cracks in a solder layer, and the like, are difficult to occur, with excellent heat dissipation performance, and with high reliability that can be maintained over a long period of time.

DISCLOSURE OF INVENTION

The inventors of the present invention have conducted various experimental studies in order to achieve the above-mentioned object and made the present invention by finding that in a structure provided with a stress buffer layer between a ceramic substrate and a metal heat sink, when various countermeasures are taken to the metal heat sink and a metal plate serving as the stress buffer layer, the module structure obtained undergoes small changes in shape and warp even under a heat history during the assembly and actual use thereof, without the heat dissipation performance thereof being impaired.

Specifically, the present invention provides a module structure in which a ceramic circuit board is bonded to a metal heat sink via a metal plate (A) the main component of which is aluminum, characterized in that the metal plate (A), with the main component thereof being aluminum, has a thickness of 400 µm or more and 1200 µm or less.

The module structure is preferably a module structure characterized in that the above-mentioned metal heat sink is composed of an aluminum alloy having a Vickers hardness of 30 Hv or more after being subjected to heat treatment at 630° C. for 4 minutes.

The above-mentioned metal plate (A) is preferably bonded to the ceramic circuit board and to the metal heat sink via a brazing filler metal. When as the brazing filler metal, there is used such a brazing filler metal that contains Al as the main component, Mg, and at least one element selected from the group consisting of Cu, Zn, Ge, Si, Sn and Ag, highly reliable bonding can be obtained.

The module is furthermore preferably a module which is characterized by comprising the above-mentioned module structure, a heat-generating electrical component which is mounted on a desired position on a circuit-formed metal plate (B) which is disposed on a side opposite the metal plate (A) of the ceramic circuit board, and a notch provided on the surface of the above-mentioned metal plate (A) and/or the above-mentioned metal heat sink, wherein when a cross section of the module is assumed, the above-mentioned notch is provided in such a region that is outside a frustum of cone region formed by a group of straight lines drawn downward at an angle of 45° with respect to the vertical direction from the edges of the heat-generating electric component in contact with the metal plate (B).

The notch is preferably provided at the surface of the metal plate (A) on the side in contact with the metal heat sink, or at the surface of the metal heat sink covered with the ceramic substrate when viewed from the side where the heat-generating electric component of the module is provided, or at the surface of the metal heat sink which is not covered with the ceramic substrate when viewed from the side where the heat-generating electric component of the module is provided.

EXPLANATION OF REFERENCE NUMERALS

Figure 1:
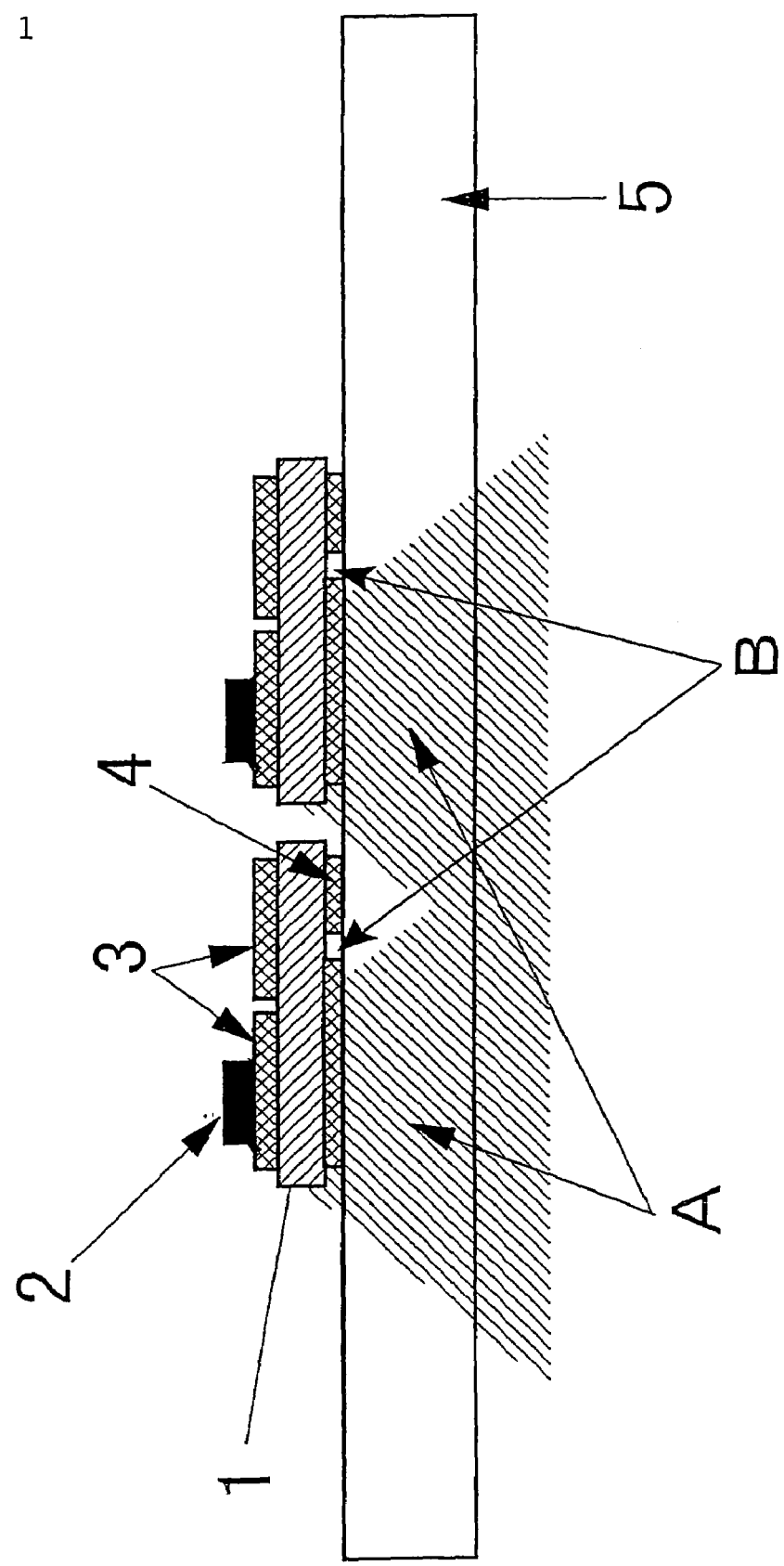
FIG. 1: a cross-sectional view of a module of Example 12 of the present invention.
Figure 2:
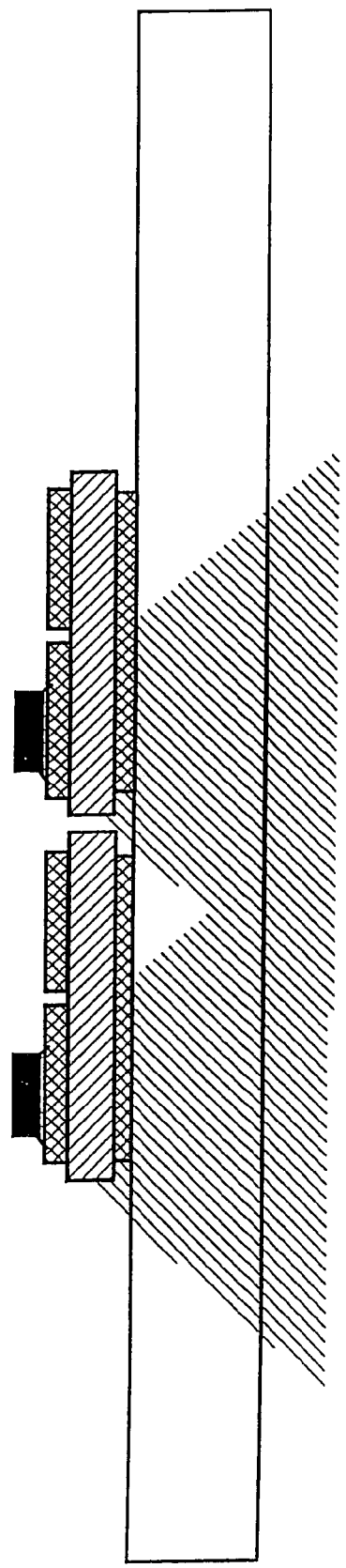
FIG. 2: a cross-sectional view of a conventionally known module of Comparative Example 4.

1: ceramic substrate
2: heat-generating electric component (semiconductor device)
3: metal plate (B)
4: metal plate (A)
5: heat sink
A: a frustum of cone formed by straight lines extending through the another metal plate and extending from edges of said heat-generating electric component in contact with the another metal plate at an angle of 45° with respect to a vertical direction.
B: notch

BEST MODE FOR CARRYING OUT THE INVENTION

The present invention will now be explained.

As a ceramic substrate for use in the present invention, any substrate may be used as long as it satisfies the required characteristics such as electric insulation, heat conductivity, and mechanical strength. In particular, aluminum nitride (AlN), which is a ceramic having a high heat conductivity, and silicon nitride ($Si_3N_4$), which has a high strength and a relatively high heat conductivity, are suitable.

A module structure of the present invention has such a structure that comprises a metal heat sink and a ceramic circuit board which is bonded to the metal heat sink. Broadly, two techniques are known for reducing thermal stress when materials with different properties are bonded. In the first technique, a heat sink with a low thermal expansion coefficient is used in order to reduce the difference in thermal expansion between two materials. This method, however, has a problem with respect to the cost as mentioned previously. The second technique is used in the present invention and is based on the idea of absorbing thermal strain by inserting a stress buffer layer between the metal heat sink and the ceramic circuit board, by which technique the relaxation of thermal stress is carried out by using the plastic deformation of a material with a low modulus of elasticity in an intermediate layer (stress relaxation layer).

The present invention is characterized in that as the stress buffer layer is used a metal plate with the main component thereof being aluminum, having a thickness of 400 μm or more and 1,200 μm or less. As mentioned above, it is essential that the stress relaxation layer has as mechanical characteristics a low modulus of elasticity and a low yield strength. However, in the present invention, for the application thereof, it is necessary that the stress relaxation layer meet such requirements that the thermal conductivity thereof be high for heat dissipation, that the stress relaxation layer not melt when a semiconductor device is soldered, and that the stress relaxation layer can be bonded to the ceramic substrate and to the metal heat sink with a sufficient strength.

The inventors have conducted an extensive study on various materials and the thickness thereof in order to find a stress relaxation layer which satisfies the above-mentioned requirements, and have made the present invention. In the present invention, as the stress relaxation layer, a metal plate with the main component thereof being aluminum is selected and is used as the above-mentioned metal plate (A). In the metal plate (A), for example, JIS (the Japanese Industrial Standards) named 1000 series aluminums are preferable for use, and of such aluminums, a high purity aluminum with a purity of 99 mass % or more is preferable, and a high purity aluminum with a purity of 99.9 mass % or more is more preferable.

In the present invention, the metal plate (A) has a thickness of 400 μm or more and 1,200 μm or less, preferably a thickness of 600 μm or more and 1,000 μm or less. When the thickness exceeds 1,200 μm, there may be a case where the stress generated by the metal plate (A) and the heat sink reaches the side of the metal plate (B) and has an adverse effect on the durability of a solder under a silicon chip. Furthermore, this degrades pattern accuracy when forming a pattern by etching and increases the cost, so that the exceeding of the thickness is not preferable. When the thickness is less than 400 μm, it may occur that the function as the buffer layer becomes insufficient due to the hardening thereof caused by the diffusion of elements from the junction, and that an Al buffer layer cannot withstand repeated stressing caused by heat cycle and is ruptured.

The present invention is characterized in that the reliability of the power module can be secured even though the metal heat sink is made of copper, aluminum, or an alloy comprising copper or aluminum as the main component, which is inexpensive and has high heat conductivity. An aluminum alloy is suitable for use in the heat sink since it is lightweight and inexpensive. When an aluminum alloy is used, preferable is such an aluminum alloy that has a Vickers hardness of 30 Hv or more, more preferable is such an aluminum alloy that has 60 Hv or more, after being subjected to heat treatment at 630° C. for 4 minutes.

The use of an aluminum alloy having the above-mentioned features for the fabrication of the heat sink can make extremely small the warping of the obtained module structure in collaboration with the fact that the thickness of the above-mentioned metal plate (A) is in an appropriate range. Furthermore, the module structure undergoes small changes in shape and warp under a heat history during the power module assembly and power module actual use, and there can be prevented the debonding of the junction interface and the rupture of the metal plate (A) serving as the buffer layer, so that the breaking of the semiconductor device and the elevation of the thermal resistance can be prevented, which have good effects on each kind of reliability of the power module.

Any aluminum alloy can be used in the heat sink as long as the aluminum alloy has the above-mentioned characteristics. Examples of such an aluminum alloy include aluminum alloys containing Al and at least one of Si or Mg in an appropriate amount, for instance, aluminum alloys of JIS named 2000 series, 5000 series, 6000 series, and 7000 series.

The content of Si and Mg in the aluminum alloy is preferably about 0.1 to 4.0 mass % from the viewpoint of physical properties and workability. Even if the content of Si and Mg exceeds the above range, as long as the Vickers hardness thereof is 30 Hv or more, more preferably 60 Hv or more, the above aluminum alloys are excellent in that the changes in shape and warp of the module structure can be made small, which is one of features of the module structure of the present invention.

The aluminum alloy for use in the present invention may contain other components and impurities as long as the above-mentioned characteristics are satisfied. Aluminum alloys containing Mg, Cu or Zn in an amount of 2.0 mass % or more have high Vickers hardness and high bending strength and are excellent in that the obtained module structure undergoes small changes in shape and in warp. Furthermore, it is only necessary that the frame of the heat sink material be composed of the above-mentioned aluminum alloy, and it is not necessary that the entire heat sink be composed of the above-mentioned aluminum alloy.

The Vickers hardness of the aluminum alloy suitable for the heat sink of the present invention has been shown. However, the property of the aluminum alloy can also be indicated in terms of the load and displacement by measuring the bending strength thereof after high temperature annealing of the aluminum alloy. Specifically, the same effect as mentioned above can be obtained in the case where a 5 mm thick, 5 mm wide test piece is heated at 600° C. for 10 minutes, and then the three-point bending strength is measured with a 30 mm span, when the displacement becomes 200 μm, the load is 200 N or more, preferably 300 N or more length.

The heat sink may be in the shape of a plate with a flat back surface or with fins being formed. The heat sink may have such a structure that a cooling medium can pass through the inside of the heat sink. Such a structure is preferable since a power control unit including the power module and a cooler can be reduced in size in its entirety, which contributes to the reduction of the cost thereof.

Furthermore, in the module structure of the present invention, the above-mentioned metal plate (A) is preferably bonded to the metal heat sink via a brazing filler metal or a lead-free solder from the viewpoints of the quality of the material, the shape, the workability, and the bonding strength of the module structure.

When a Pb—Sn type solder is used for bonding the heat sink and the ceramic circuit board, there are caused the above-mentioned problems such as the lowering of the reliability caused by solder cracks in the course of the heat cycle, the environmental problems, the necessity for plating the surface of aluminum due to the poor solder wettability of aluminum, so that the use of the Pb—Sn type solder is not preferable. However, these problems can be overcome by using a brazing filler metal. Furthermore, in the present invention, it is furthermore preferable that the metal plate (A) the main component of which is aluminum be bonded to the ceramic circuit board via a brazing filler metal.

In the present invention, the brazing filler metal for bonding the heat sink and the metal plate (A) and for bonding the metal plate (A) and the ceramic substrate may be appropriately selected according to the kind of metal heat sink to be used, or the like. In particular, when there is used a brazing filler metal comprising Al as the main component, Mg, and at least one element selected from the group consisting of Cu, Zn, Ge, Si, Sn and Ag, bonding with high reliability can be obtained. It is appropriate that the content of Mg in the above-mentioned brazing filler metal is 0.1 to 2.0 mass %. When the content is less than 0.1 mass %, a sufficient junction cannot be obtained, while when the content is more than 2.0 mass %, there may be a case where the thermal shock resistance of the junction is lowered or things unfavorable occur for the operation of a bonding furnace. As aluminum alloys suitable for use in the brazing filler metal of the present invention, there can be used, for example, aluminums with appropriate compositions in JIS named 2000 series, 3000 series, 5000 series, 6000 series, and 7000 series.

The brazing filler metal may be either an alloy or a non-alloy, which may be in any form of foil, powder, mixed powder, or mixed powder containing a compound in which the above-mentioned metal component remains at a temperature not more than the bonding temperature, or any combination thereof. An alloy foil is excellent, for instance, in that the junction has heat cycle resistance, and that micro voids are hardly formed, and that it is easy to handle. In particular, a JIS named 2017 aluminum alloy foil is good for bonding the metal plate (A) and the ceramic substrate.

Furthermore, in order to bond the heat sink and the metal plate (A), it is necessary to set the bonding temperature at a temperature not higher than the melting point of the heat sink, so that in order to lower the melting point of the above-mentioned brazing filler metal composition, if necessary, the amount of the components other than Al may be increased. For example, the most preferable result can be obtained when the above-mentioned Al alloy foil and a silver foil or a silver powder are used in combination. With respect to the thickness of the brazing filler metal, when the thickness is 10 to 60 μm, preferably 10 to 40 μm, good reproducibility and strong junction with excellent heat cycle resistance performance can be obtained.

When the Al alloy heat sink and the metal plate (A) the main component of which is aluminum are bonded, generally the bonding is preferably carried out in vacuum with the application of heat thereto. At this time, when both junction surfaces have large irregularity or roughness, there may be a case where bonding failure frequently occurs or the heat cycle resistance of the junction becomes inferior. When bonding is performed in nitrogen, the shape of the surface of the component to be bonded is largely affected, and bonding failure is apt to occur at an outer peripheral portion of the metal plate (A). In particular, when an extrusion material is used for the heat sink, there is a case where extrusion marks formed on the surface of the heat sink causes bonding failure or debonding during a heat cycle test. These problems can be resolved by use of a Mg-containing Al alloy foil or a combination of an alloy powder and a Ag powder or a Ag foil. The use of such an alloy and Ag in combination is epoch-making in that a junction having sufficient durability and high reliability can be obtained even in a nitrogen atmosphere. Moreover, even when the Vickers hardness of the heat sink after the heat treatment thereof is high or when the bending strength thereof is high, the use of the combination is preferable since a strong junction which is difficult to be unbonded can be obtained. Since this method makes it possible to perform junction in nitrogen, the junction can be carried out in a common continuous furnace with a nitrogen atmosphere, so that the cost for the production can be sharply reduced.

In performing brazing, when the brazing filler metal is an alloy foil, the brazing is carried out by holding the alloy foil between the heat sink and the metal plate (A) or between the metal plate (A) and the ceramic substrate, with the application of heat thereto in vacuum, in nitrogen, or in an inert gas. When an alloy powder or a metal powder mixture is used as the brazing filler metal for bonding the heat sink and the metal plate (A) or for bonding the metal plate (A) and the ceramic substrate, the bonding can be carried out by coating the alloy powder or the metal powder mixture onto one of the surfaces thereof by use of a roll coater or a screen printing machine. When the amount of coating is insufficient, sufficient bonding cannot be carried out, while when the amount of coating is excessive, the brazing filler metal disadvantageously flows out beyond the junction, or a hard, fragile layer is formed at the interface so that the reliability of junction may be impaired. The amount of coating is preferably about 1 to 5 mg/cm$^2$.

When the heat sink and the metal plate (A) are bonded by use of the Ag alloy brazing filler metal foil and a Ag powder in combination, the effect of using silver in combination can be obtained by merely coating the silver powder onto one face of the brazing filler metal foil, the heat sink or the metal plate (A). The amount of coating of the silver powder is sufficient in the amount of about 1 to 3 mg/cm$^2$.

Furthermore, in the present invention, a lead-free solder may be used to bond the metal heat sink and the metal plate (A). It is said that in comparison with Pb—Sn type solders, lead-free solders are harder and do not readily undergo plastic deformation, so that usually cracks are readily formed in lead-free solders by heat cycle. However, in this invention, a sufficiently reliable module structure can be obtained. The reliability can be secured by using as the lead-free solder a Sn—Ag—Cu type solder or a Sn—Zn type solder. In particular, a Sn—Ag (3 mass %) —Cu (0.5 mass %) solder is preferable to use.

The metal plate (B), which is disposed on one face of the ceramic substrate and on a portion of which a heat-generating electrical component is mounted to constitute a circuit, may be composed of any metal having good electric conductivity. As such a metal, copper, aluminum, and alloys thereof are preferably employed, which are inexpensive and have high heat conductivity. As the above-mentioned copper and aluminum, preferably employed are those having high purity which exhibit high electric conductivity and high plastic deformation performance under the generation of stress.

In the present invention, it is preferable to provide a notch at a particular position of an upper surface and/or a lower surface of the metal plate (A) and/or the metal heat sink, which metal plate (A) is disposed on the ceramic substrate on the side of the heat sink so as to be in contact with the heat sink. This is because the notch is capable of relaxing the strain of the metal plate (A) which is caused by thermal stress generated by a difference between the thermal expansion coefficient of the ceramic substrate and that of the heat sink during the heat treatment, for instance, at the time of mounting a heat-generating electric component such as a semiconductor device, while maintaining almost the same level of heat dissipation performance as in the case where no notch is formed, and the notch is also capable of reducing the deformation of this module structure under a temperature history thereof.

In the present invention, the position for introducing the notch, namely the place where the notch is provided, is set, when a cross section of the module is assumed as shown in FIG. 1 to FIG. 6, outside the region of a frustum of cone formed by a group of straight lines drawn downward at an angle of 45° with respect to the vertical direction from the edges of the heat-generating electric component in contact with the metal plate (B), that is, outside the region of the frustum. By forming the notch in the above-mentioned specific position, the dissipation performance of the heat generated from electric components such as the semiconductor device in the module or from circuits, is not impaired, so that the occurrence of such phenomena as the malfunction of the semiconductor device and the shortening of the life can be prevented, without elevating the temperature of the semiconductor device.

The position for introducing the notch can be varied in accordance with the size, the shape and the mounting position of the heat-generating electric component to be mounted. For the reduction of the deformation of a heat dissipation structure, the most effective way is to provide a notch introduced from the side of the heat sink into the metal plate (A) which is provided so as to come into contact with the heat sink on the heat sink side of the ceramic substrate. The greater the depth of the notch, the greater the effect of reducing the deformation of the module structure. It is preferable that the metal plate be divided, but it is not always necessary to divide the metal plate. The width, the shape, and the number of the notches may be suitably selected unless the notch is in a region where the heat dissipation performance is impaired.

Furthermore, by introducing the notch into a portion of the heat sink where the heat sink is in contact with the metal plate (A), the same effect can be obtained. In this case, the notch can be introduced into the surface of the heat sink by a simple groove formation working or the like, which is effective for attaining excellent productivity. Also in this case, the greater the depth of the notch, the greater the effect. However, the depth is preferably not more than ½ the thickness of the heat sink. When there is provided a notch which is deeper than that, there may be a case where the module structure, which is fabricated by bonding the ceramic circuit board and the heat sink, is greatly deformed. The width, the shape, and the number of the notches may be suitably selected as long as the notches are within the above-mentioned specific range.

In the case where no notch can be provided at the interface between the metal plate and heat sink due to the restrictions thereon imposed by the size, the shape, and the position of the heat-generating electric component, the deformation reducing effect can be obtained by providing the notch at an upper surface and/or a lower surface of the heat sink other than the junction interface. In this case, greater is the freedom to select a place for the notch, which is spatially remote from portions which perform important functions of the module, where the heat-generating electric component, circuits, the ceramic substrate, and others are located, so that the productivity is excellent and as a result, there can be obtained the effect of making the cost of the module furthermore inexpensive.

The ceramic circuit board for use in the present invention can be easily produced by bonding a ceramic to the metal plate (B) for circuits, and the metal plate (A) the main component of which is aluminum, forming a circuit by a conventionally known technique, such as etching or machining, or forming a notch in the metal plate (A). Alternatively, the ceramic circuit board can also be produced by bonding a metal plate (A, B) on which circuits and a notch have been mounted in advance to a ceramic substrate.

To a method of obtaining the module structure and the module of the invention, a conventionally known method can be applied. A method which will be described later has good reproducibility, and high productivity, by which the module structure and the module of the present invention can be obtained.

Specifically, preferable is a method by which a ceramic circuit board is made ready in advance, the ceramic circuit board being provided in advance by brazing or the like with a circuit-formed metal plate (B) on a front surface thereof and a metal plate (A) the main component of which is aluminum, serving as a stress relaxation layer, on a back surface thereof, a brazing filler metal is disposed between the surface of the stress relaxation layer and a metal heat sink, and the ceramic circuit board and the metal heat sink are bonded with the application of heat thereto under pressure; alternatively, preferable is a method by which the metal plate (B) for circuit, the ceramic substrate, the metal plate (A) the main composition of which is aluminum, serving as a stress relaxation layer, and the metal heat sink are successively stacked, with a brazing filler metal being interposed between each of them, and are bonded simultaneously.

Furthermore, in order to fabricate a module structure provided with a notch, preferable is a method by which a notch is introduced in advance into the surface of the metal plate (A) of the ceramic circuit board or into the surface of the metal heat sink by etching, machining or the like, then disposing a brazing filler metal between the metal plate (A) of the ceramic circuit board and the metal heat sink, and bonding the ceramic circuit board and the metal heat sink with the application of heat thereto under pressure; alternatively, a method by which the metal plate (B) for circuit, the ceramic substrate, the notch-introduced metal plate (A) the main component of which is aluminum, and the metal heat sink are successively stacked, with a brazing filler metal being interposed between each of them, and are bonded simultaneously. Furthermore, in the latter method, the metal plate (B) for circuit may be one with a circuit being formed in advance, or a circuit may be formed after the bonding, with the application of a method such as etching. In the case where the notch is introduced into the region other than the injunction interface of the heat sink, the notch may be provided after the bonding.

Next, by mounting an electronic component, such as a semiconductor device, by soldering or the like onto the circuit of the module structure that is composed of the ceramic circuit board and the metal heat sink, and when necessary, by conducting wire bonding or like to complete a circuit, the module of the present invention can be obtained.

The power module on which a high heat-generating electric component such as a high output semiconductor device, assembled by use of the module structure of the present invention, is used with the attachment of a heat dissipation unit such as heat dissipation fins through a high heat conductive grease when the metal heat sink is a solid plate. When the heat sink is in a shape with the attachment of fins thereto, the heat sink is used as it is. When the heat sink is a pipe through which a cooling medium is allowed to flow, pipe installation for allowing the cooling medium to flow is carried out and then the power module is used.

The present invention will now be explained more specifically by giving Examples and Comparative Examples below. The present invention is not limited by these Examples.

EXAMPLES 1, 2, 3, 4, 5 AND COMPARATIVE EXAMPLES 1, 2

As a ceramic substrate was prepared a silicon nitride substrate with a heat conductivity of 75 W/mK by the laser flash technique and an average three-point bending strength of 650 Mpa, with a size of 34×34×0.635 mm. An Al plate with a purity of 99.99% and a thickness of 0.4 mm (hereinafter referred to as the Al circuit plate) was prepared as the metal plate for the circuit. As an Al plate for a stress buffer layer (hereinafter referred to as the buffer Al plate) there were prepared Al plates with a purity of 99.99% and various thicknesses as shown in Table 1.

On the front side and the back side of the silicon nitride substrate, the above-mentioned Al circuit plate and the buffer layer Al plate were overlaid through a JIS named 2017 Al foil (thickness of 20 µm), and a pressure of 5 MPa was applied thereto in the vertical direction. Both of the above-mentioned Al plates were bonded to the silicon nitride substrate in a vacuum of the order of $10^{-3}$ Pa, with the application of heat thereto at 635° C.

After the bonding, an etching resist was applied by screen-printing to a desired portion of the surface of the Al plate, and a circuit pattern was formed by etching the portion with a ferric chloride solution, whereby a ceramic circuit board was fabricated.

A JIS named 1050 aluminum plate with a size of 50×50×4 mm was prepared as the heat sink. A JIS named 2017 aluminum foil with a thickness of 20 µm was held between the buffer Al plate bonded to the above-mentioned ceramic board and the heat sink, and was subjected to heat treatment in vacuum on the order of $10^{-3}$ Pa at 600° C. for 4 minutes, with the application of a pressure of 5 MPa thereto in the vertical direction using a graphite jig, whereby the ceramic circuit board was bonded to the heat sink. The aluminum surface of the bonded product was plated with nickel by electroless plating to obtain a module structure. Ten module structures with the same structure were fabricated.

A 10×10×0.3 mm silicon chip with a Au plated back side was bonded to the Al circuit surface of the module structure fabricated using a solder with the mass ratio of lead to tin being 90:10 at 350° C.

The module was subjected to 3,000 heat cycles with each cycle being −40° C.×30 minutes→room temperature×10 minutes→125° C.×30 minutes→room temperature×10 minutes. Subsequently, the interface between the ceramic substrate and the heat sink and the interface between the ceramic substrate and the silicon chip were examined with an ultrasonic flaw detector to determine the presence or absence of cracks and debonding at the bonding interfaces. The results are shown in Table 1.

Except in Comparative Example 1, debonding of the bonded portions and cracks in the silicon nitride substrate, caused by the heat cycle, were not observed in any of the modules. In Comparative Example 1, part of the bonded portion became debonded, and fatigue breaking of the buffer Al plate conspicuously took place. In Example 1, fatigue breaking was observed at the corners of the buffer layer Al plate. In Comparative Example 2, cracks were observed over the entire surface of the solder layer between the silicon chip and the circuit board. In Example 5, some cracks were observed in the solder layer.

TABLE 1

|  | Thickness of buffer Al plate (μm) | Ratio of defects after 3,000 heat cycles (*) |
|---|---|---|
| Example 1 | 400 | 4/10 |
| Example 2 | 600 | 1/10 |
| Example 3 | 800 | 0/10 |
| Example 4 | 1000 | 1/10 |
| Example 5 | 1200 | 3/10 |
| Comparative Example 1 | 200 | 10/10 |
| Comparative Example 2 | 1600 | 8/10 |

(*) Number of defective test pieces to the total number of test pieces

EXAMPLES 6, 7, 8, 9, 10, 11 AND COMPARATIVE EXAMPLE 3

By using 7 types of heat sinks shown in Table 2, modules were prepared and evaluated with a repeating number of 10, to make them Examples of the present invention and Comparative Examples.

As a ceramic substrate was prepared an AlN (aluminum nitride) substrate with a size of 34×34×0.635 mm, a heat conductivity of 180 W/mK by the laser flash method, and an average three-point bending strength of 400 Mpa. 2 JIS named 1085 Al (aluminum) plates, each having a size of 30×30×0.4 mm, were prepared, one being a metal plate to be made a circuit, and the other being a metal plate to be provided on the surface of the above-mentioned AlN substrate directed toward the heat sink (hereinafter referred to as the substrate back surface).

The above-mentioned Al plates were overlaid on the above-mentioned AlN substrate, one on the front surface of the AlN substrate and the other on the back surface of the AlN substrate, each of the Al plates being superimposed through a JIS named 2017 Al foil (20 μm thick), and a pressure of 10 Mpa was applied thereto in the vertical direction. The Al plates and the AlN substrate were bonded in a vacuum of $10^{-3}$ Pa with the application of heat thereto at 630° C. for 20 minutes. After the bonding, an etching resist was applied by screen-printing on a desired portion of the surface of the Al plate, and a circuit pattern was formed by etching with a ferric chloride solution, whereby a ceramic circuit board was fabricated.

Next, as heat sinks were prepared aluminum plates with a size of 46×46×4 mm, having compositions as shown in Table 2. Silver powder was applied by screen-printing in an amount of 1.5 mg/cm² onto the heat-sink-contacting surface of each ceramic circuit board. A JIS named 2017 Al foil with a thickness of 20 μm was interposed between the applied silver powder and the heat sink, and the heat sink and the ceramic circuit board were bonded by heat treatment at 510 to 600° C. in a nitrogen atmosphere for 4 minutes, with the application of a pressure of 10 MPa in the vertical direction by use of a graphite jig. Finally, the entire surfaces of the substrate and a heat dissipation plate were subjected to Ni electroless plating, whereby a module structure was obtained.

A 13×13×0.4 mm silicon chip with an Au plated back side was bonded to the Al circuit surface of the fabricated module structure by use of a solder with the mass ratio of lead to tin being 90:10 at 350° C.

The warp of the silicon chip of the module obtained by the above procedure was measured. The warp was evaluated as the difference between the height of the center and the height of the opposite ends of the silicon chip on the diagonal line thereof. The average warp of ten samples is shown in Table 3.

TABLE 2

|  | Composition of heat sink (mass %) | Vickers hardness (*) (Hv) |
|---|---|---|
| Example 6 | 0.4 Si—0.5 Mg—balance Al | 30 |
| Example 7 | 0.55 Si—0.75 Mg—balance Al | 47 |
| Example 8 | 0.2 Si—0.4 Mg—3.5 Cu—balance Al | 71 |
| Example 9 | 0.25 Si—2.4 Mg—balance Al | 68 |
| Example 10 | 0.4 Si—4.2 Mg—balance Al | 92 |
| Example 11 | 0.4 Si—2.1 Mg—5.1 Zn—balance Al | 83 |
| Comparative Example 3 | Al (99.99) | 13 |

(*) After heat treatment at 630° C. for 4 minutes

TABLE 3

|  | Warp (μm) |
|---|---|
| Example 6 | 5.3 |
| Example 7 | 4.7 |
| Example 8 | 2.1 |
| Example 9 | 2.1 |
| Example 10 | −0.3 |
| Example 11 | 0.2 |
| Comparative Example 3 | 23.6 |

*Warp is an average of the differences between the height at the opposite end portions and the height at a central portion on a diagonal line of the silicon chip.
+: The side of the silicon chip was convex.
−: The side of silicon chip was concave.

EXAMPLE 12 AND COMPARATIVE EXAMPLE 4

As a ceramic substrate was prepared a silicon nitride substrate (size 34×26×0.635 mm) with a heat conductivity of 70 W/mK measured by the laser flash method and an average three-point bending strength of 750 MPa. As the metal plate (A) and the metal plate (B) were prepared aluminum plates with a purity of 99.99% and a thickness of 0.4 mm.

The aluminum plates were overlaid on the silicon nitride substrate, one on the front surface of the silicon nitride substrate and the other on the back surface of the silicon nitride substrate, each of the aluminum plates being overlaid through a JIS named 2017 Al foil (20 μm thick), and a pressure of 5 MPa was applied thereto in the vertical direction. The Al plates were bonded to the silicon nitride substrate in a vacuum on the order of $10^{-3}$ Pa with the application of heat thereto at 635° C.

After the bonding, an etching resist was applied by screen-printing onto a desired portion of the surface of the upper and lower aluminum plates, and a circuit pattern was formed on the metal plate (B) by etching with a ferric chloride solution, whereby a ceramic circuit board was fabricated, with the formation of a notch for the relaxation of strain in the metal plate (A) in Example 12. The notch was provided in such a region that is outside a frustum of cone region formed by a group of straight lines drawn downward at an angle of 45° with respect to the vertical direction from the edges of a semiconductor device which is one of heat-generating electric components to be mounted later and is in contact with the metal plate (B). In Comparative Example 4, a ceramic circuit board was fabricated by the same technique, without providing the notch in the metal plate (A).

Next, as the heat sink was prepared a JIS named 1050 aluminum plate with a size of 60×140×4 mm having four tapped holes. A JIS named 2017 Al foil was inserted between two of the above-mentioned ceramic circuit boards and this aluminum plate, and the heat sink and the ceramic circuit boards were bonded with the application of pressure in the vertical direction by use of a graphite jig, in a vacuum on the order of $10^{-3}$ Pa with the application of heat thereto 590° C. for 10 minutes, whereby a module structure was fabricated.

Next, the changes in warp were measured with the assumption of a temperature history before and after the soldering of the semiconductor device. The warp was measured by the following method. First, the shape of the bottom of the module structure after the bonding was measured in the longitudinal direction from one end to the other end (span: 140 mm) by use of a contour analyzer of a stylus type, and value determination thereof was carried out with both-ends compensation. The module structure was then subjected to heat treatment at 360° C. for 10 minutes, and the shape of the bottom was measured to determine the difference in shape before and after heating. The maximum difference was assumed as the amount of warp. The results are shown in Table 4.

Next, in order to evaluate the heat dissipation performance, the module structure was plated with nickel in the entire surface thereof by electroless plating, and a 10 mm-square semiconductor device was soldered onto a predetermined position of the circuit at 360° C. in a reducing atmosphere by use of a high-temperature solder. The cross-sectional structures of the modules of Example 12 and Comparative Example 4 are shown respectively in FIGS. 1 and 2. An aluminum heat dissipation unit was fixed on the bottom face of the module structure with four screws through silicone grease therebetween. The thermal resistance was determined by measuring the temperature of a silicon device and the aluminum heat dissipation unit, while cooling the heat dissipation unit with water, and causing a constant current to flow in the thickness direction of the silicon device. The results are shown in Table 4.

TABLE 4

| | Position of notch | Differential warp* | Thermal resistance* |
|---|---|---|---|
| Ex. 12 | Metal plate (A) | 50 | 100 |
| Ex. 13 | Portion of upper face of heat sink in contact with the ceramic circuit board | 38 | 100 |
| Ex. 14 | Portion of upper face of heat sink out of contact with the ceramic circuit board | 60 | 100 |
| Ex. 15 | Lower face of heat sink | 75 | 100 |
| Comp. Ex. 4 | None | 100 | 100 |
| Comp. Ex. 5 | Metal plate (A) | 42 | 130 |

*The values are relative ones when the value of Comparative Example 4 is 100.

The obtained module was subjected to 3,000 heat cycles with each cycle being −40° C.×30 minutes→room temperature×10 minutes→125° C.×30 minutes→room temperature×10 minutes. Subsequently, the bonding interface between the ceramic substrate and the heat sink was examined with an ultrasonic flaw detector to determine the presence or absence of debonding at the bonding interface. In any modules, abnormalities such as the debonding of the circuit board and the occurrence of cracks in the silicon nitride substrate caused by the heat cycles were not observed.

COMPARATIVE EXAMPLE 5

Figure 3:
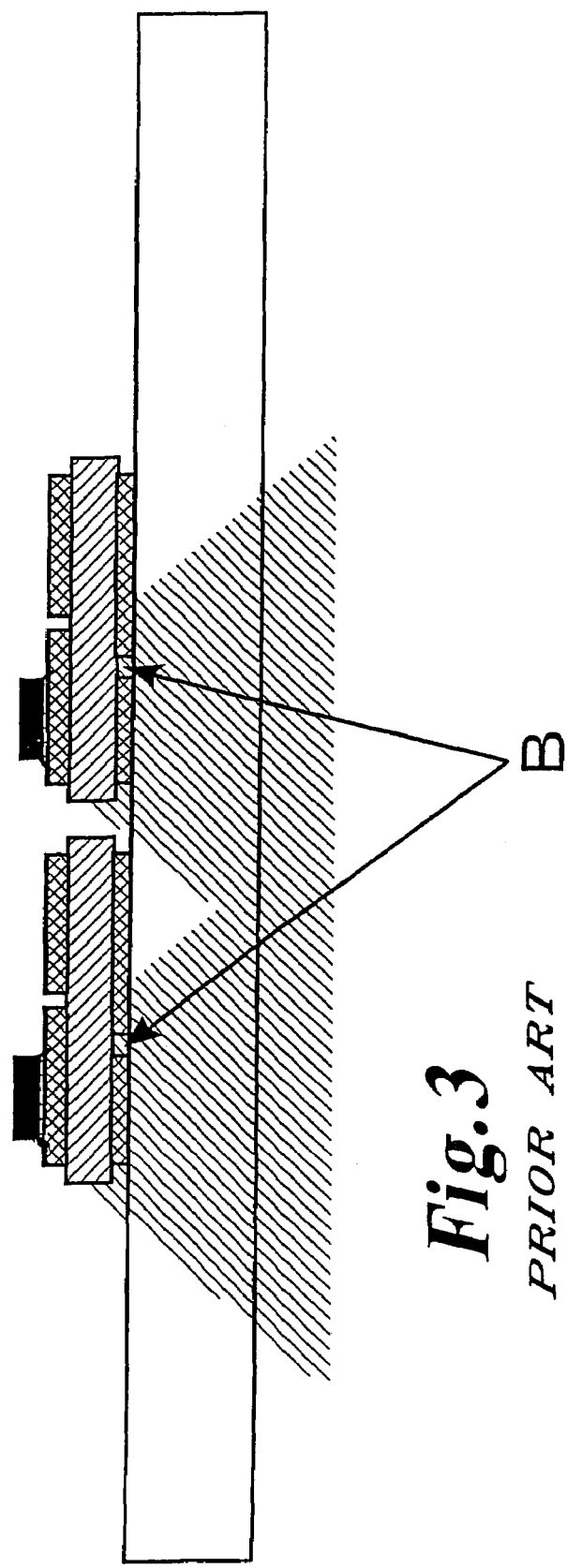
FIG. 3: a cross-sectional view of a conventionally known module of Comparative Example 5.

A module was fabricated in the same manner as in Example 12 except that a cutout to be introduced into the metal plate (A) was provided below the silicon device downward in the vertical direction. In the same manner as in Example 12, the changes in the warp of the semiconductor device before and after the soldering of the semiconductor device and the thermal resistance were evaluated. The cross-sectional structure of the module is shown in FIG. 3, and the results of evaluation are shown in Table 4.

EXAMPLE 13

Figure 4:
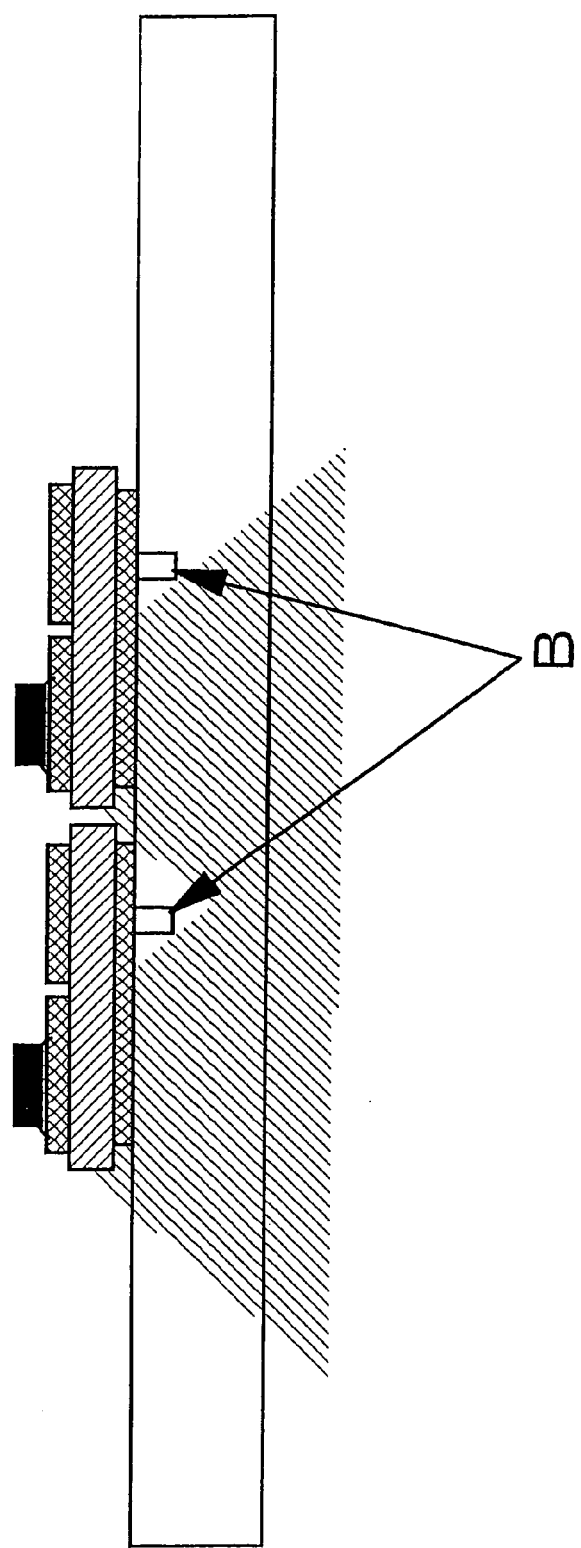
FIG. 4: a cross-sectional view of a module of Example 13 of the present invention.

A module was fabricated in the same manner as in Comparative Example 4 except that a groove with a width of 1 mm and a depth of 1.5 mm was formed using a diamond cutter in such a region that is outside a frustum of cone region formed by a group of straight lines drawn downward at an angle of 45° with respect to the vertical direction from the edges of the semiconductor device to be mounted in a later step in contact with the metal plate (B) and in a portion where the aluminum heat sink is in contact with the ceramic circuit board. The module was evaluated in the same manner as in Comparative Example 4. The cross-sectional structure of the module is shown in FIG. 4, and the results of the evaluation are shown in Table 4.

EXAMPLES 14 AND 15

Figure 5:
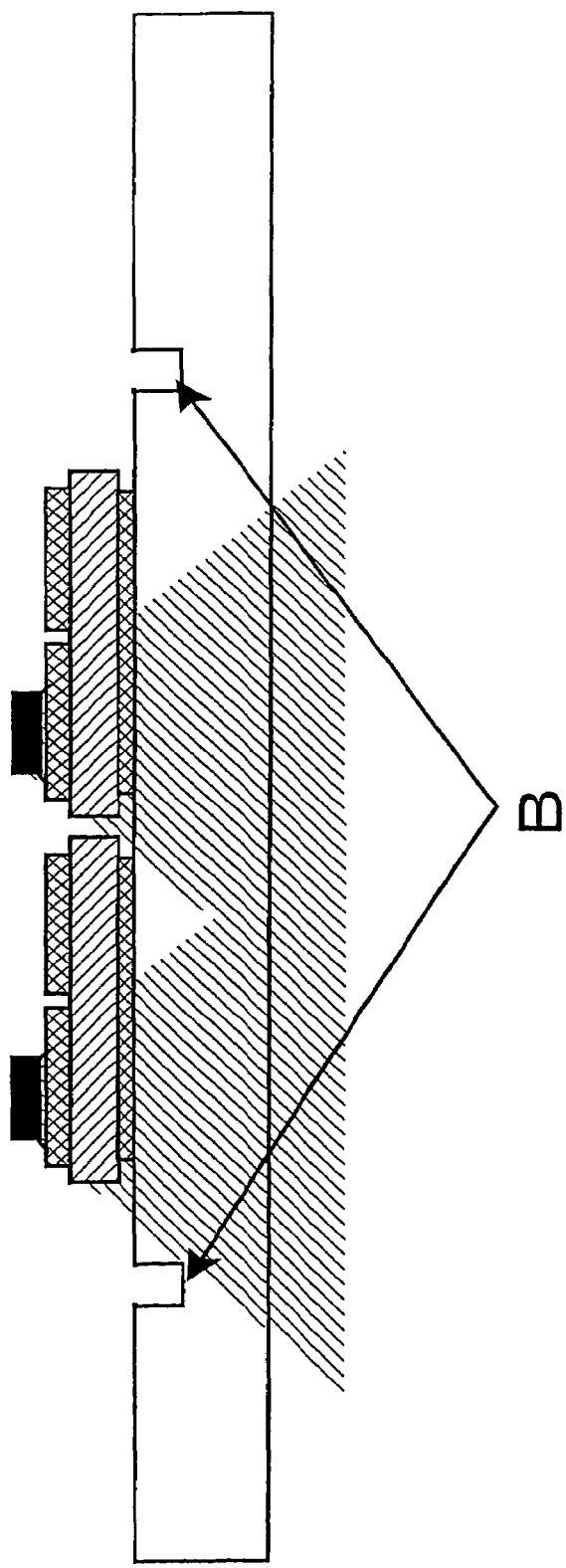
FIG. 5: a cross-sectional view of a module of Example 14 of the present invention.
Figure 6:
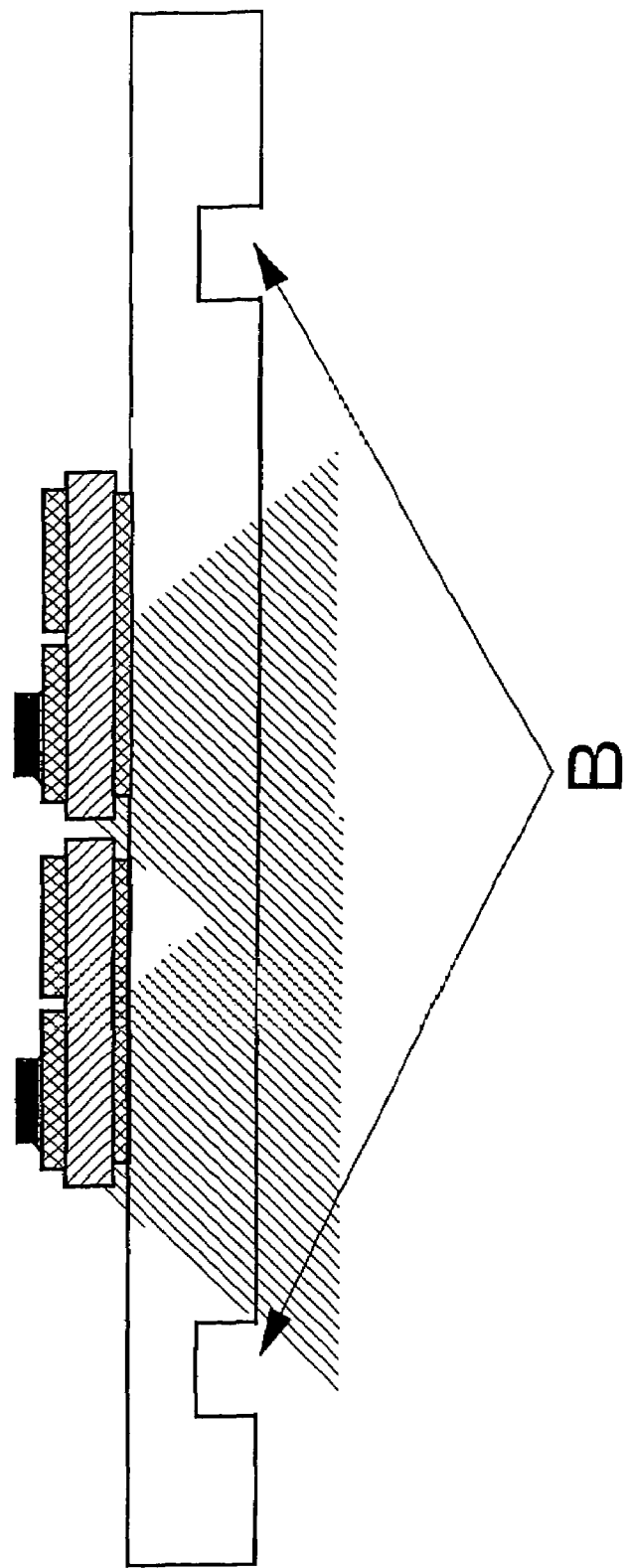
FIG. 6: a cross-sectional view of a module of Example 15 of the present invention.

Modules, each comprising a ceramic circuit board bonded to an aluminum heat sink, were fabricated by the same method as in Comparative Example 4. In Example 14, grooves were formed at the positions of the upper face of the heat sink as shown in FIG. 5. In Example 15, grooves were formed at the positions of the lower face of the heat sink as shown in FIG. 6, each groove having a width of 3 mm and a depth of 2 mm. Thereafter, modules were fabricated and evaluated by the same method as in Comparative Example 4. The results are shown in Table 4.

INDUSTRIAL APPLICABILITY

The module structure and the module using the same of the present invention are characterized in that despite the use of an inexpensive metal in the heat sink, the deformation is small even under a temperature history at the mounting of a semiconductor device or the like, the assembling thereof is easy, abnormalities such as the debonding at the bonding interface, the fatigue breaking of the aluminum layer, the cracking of the ceramic substrate, and cracks in the solder layer, hardly occur, and the heat dissipation performance is excellent, so that the module structure and the module using the same of the present invention are suitable for power modules for various applications, in particular, to power modules for transportation apparatus, and therefore are industrially very useful.

The invention claimed is:

1. A module structure comprising a ceramic circuit board bonded to a metal heat sink through a metal plate having a main component of which is aluminum, wherein the thickness of said metal plate is 400 µm or more to 1200 µm or less,
wherein the heat sink comprises an aluminum alloy having a Vickers hardness of 30 Hv or more.

2. The module structure according to claim 1, wherein said metal plate is bonded to the ceramic circuit board and to the metal heat sink through a brazing filler metal.

3. The module structure according to claim 2, wherein the brazing filler metal comprises Al as the main component, Mg, and at least one element selected from the group consisting of Cu, Zn, Ge, Si, Sn, and Ag.

4. A module structure comprising a ceramic circuit board bonded to a metal heat sink through a first metal plate having a main component of which is aluminum, wherein the thickness of said first metal plate is 400 µm or more to 1200 µm or less, further comprising:
a heat-generating electric component provided at a predetermined position of another metal plate with a circuit formed thereon, the another metal plate being provided on the side of the ceramic circuit board opposite the first metal plate, and a notch provided at the surface of at least one of said first metal plate and said metal heat sink, wherein in a cross section of said module, said notch is provided in such a region that is outside a frustum of a cone formed by straight lines extending through the another metal plate and extending from edges of said heat-generating electric component in contact with the another metal plate at an angle of 45° with respect to a vertical direction.

5. The module according to claim 4, wherein the notch is provided on the surface of the first metal plate in contact with the metal heat sink.

6. The module according to claim 4, wherein the notch is provided on the surface of the metal heat sink covered with the ceramic substrate when viewed from the heat-generating electric component of said module.

7. The module according to claim 4, wherein the notch is provided on the surface of the metal heat sink which is not covered with the ceramic substrate when viewed from the heat-generating electric component of said module.

* * * * *